United States Patent [19]

Jochi

[11] Patent Number: 4,965,860

[45] Date of Patent: Oct. 23, 1990

[54] CAPACITOR TYPE WELDING POWER UNIT

[75] Inventor: Takashi Jochi, Abiko, Japan

[73] Assignee: Miyachi Electronic Company, Chiba, Japan

[21] Appl. No.: 310,680

[22] Filed: Feb. 15, 1989

[30] Foreign Application Priority Data

Mar. 15, 1988 [JP] Japan .................................. 63-61106
Jun. 21, 1988 [JP] Japan ................................ 63-153149

[51] Int. Cl.$^5$ ........................................... B23K 11/26
[52] U.S. Cl. ......................................... 219/113; 320/1
[58] Field of Search ...................... 219/113, 110, 108; 320/1

[56] References Cited

U.S. PATENT DOCUMENTS 4,228,340 10/1980 Dufrenne ............................ 219/113
4,464,556 8/1984 Krufka ................................ 219/113
4,736,149 4/1988 van den Eijnden .................... 320/1

FOREIGN PATENT DOCUMENTS

49-12461 3/1974 Japan ................................. 219/113

Primary Examiner—Clifford C. Shaw
Attorney, Agent, or Firm—Wenderoth, Lind & Ponack

[57] ABSTRACT

A capacitor type welding power unit incorporates a constant-current charging control circuit which serves to control a charging current being supplied to a capacitor so as to be substantially constant during the charging. By such a control circuit, which typically performs a thyristor firing control, the charging voltage of the capacitor is made to follow a reference signal, which is preferably set to change linearly with time, and it reaches a preset target value in a predetermined time regardless of fluctuations in the supply voltage. Furthermore, such a control circuit enables the capacitor to be directly connected to the output terminals of a rectifier circuit with no charging resistor being provided so as to reduce resistance heating and so as to lower power consumption in charging the capacitor.

6 Claims, 11 Drawing Sheets

FIG. 3(A)

TRIANGLE
SIGNAL TR

FIG. 3(B)

ERROR
SIGNAL ER

FIG. 3(C)

THYRISTOR
FIRING
PULSE $G_0(G_a,G_b)$

FIG. 4(A)
INPUT SIGNALS FOR OPERATIONAL AMPLIFIER 32

FIG. 4(B)
OUTPUT SIGNAL $G_o$ FROM OPERATIONAL AMPLIFIER 32

FIG. 4(C)
CHARGING CURRENT $I_c$

CAPACITOR TYPE WELDING POWER UNIT

BACKGROUND OF THE INVENTION

This invention relates to a welding power unit of the type which is adapted to charge a capacitor for producing a DC welding current and, more particularly to a control circuit of the power unit to improve the charging characteristics of the power unit.

A capacitor type welding power unit is usually used in a resistance welding machine. Such a power unit includes one or more capacitors that by degrees store a predetermined amount of electrical energy necessary for the desired welding, and instantaneously discharge most of the stored electric energy to a welding transformer to produce a DC welding current for the welding. The advantage of the power unit of this type is that the supply voltage can be reduced and the size of the circuit can be reduced.

Figure 10:
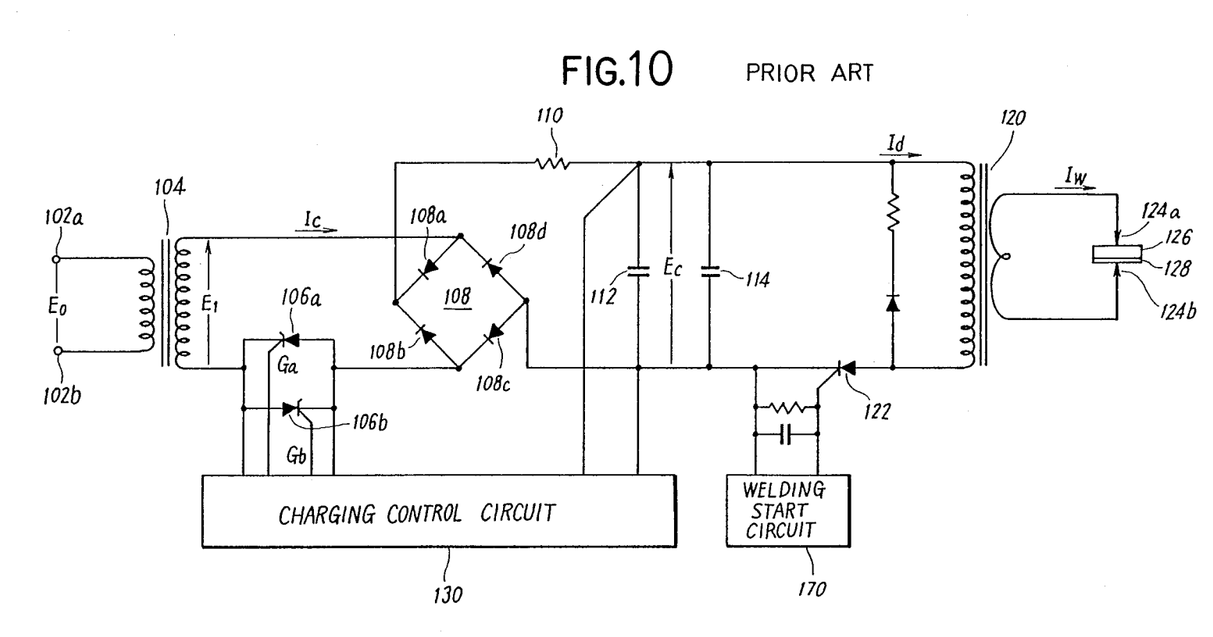
FIG. 10 is a block diagram of a typical prior art capacitor type welding power unit.

FIG. 10 shows a circuit diagram of a typical prior art capacitor type welding power unit. The power unit inputs a commercial AC voltage Eo of a predetermined value, for example 100 V through a pair of input terminals 102a and 102b. The AC voltage Eo is applied to the primary winding of a charging transformer 104 which is a single-phase transformer for boosting the AC voltage Eo to obtain an AC voltage E1 of a predetermined value, for example 400 V on the secondary winding thereof. The AC voltage E1 is applied to a rectifier circuit 108 only when either a thyristor 106a or a thyristor 106b is in the "ON" or conductive state.

When the thyristor 106a is conductive in the positive half-cycle of the AC voltage E1, a current Ic flows in a closed circuit established by the secondary winding of the transformer 104, diodes 108a and 108c of the rectifier circuit 108, a resistor 110, a pair of capacitors 112 and 114, and the thyristor 106a. When the thyristor 106b is conductive in the negative half-cycle of the AC voltage E1, the current Ic flows in another closed circuit established by the secondary winding of the transformer 104, diodes 108b and 108d of the rectifier circuit 108, the resistor 110, the capacitors 112 and 114, and the thyristor 106b. Each time the current Ic flows, the capacitors 112 and 114 are charged with some amount of electrical charge.

In this manner, the thyristors 106a and 106b are alternately turned on at a predetermined control angle or angle of retardation in each half-cycle of the commercial AC frequency, and the resulting current Ic, having an average or RMS value in accordance with the control angle, is supplied as a charging current to the capacitors 112 and 114. The thyristors 106a and 106b are respectively turned on by thyristor firing pulses Ga and Gb which are provided from a charging control circuit 130.

The charging voltage Ec of the capacitors 112 and 114 are monitored by the charging control circuit 130. When the charging voltage Ec reaches a predetermined value Eco, the circuit 130 stops the firing of the thyristors 106a and 106b to complete the charging of the condensers 112 and 114.

About the time when the charging is completed, a welding start circuit 170 turns a thyristor 122 on so that a discharging circuit for the capacitors 112 and 114 is established by the thyristor 122 and the primary winding of a welding transformer 120. Thus, the condensers 112 and 114 instantaneously discharge their electrical charge, and thereby a current Id flows in the discharging circuit and a corresponding large current Iw flows as a welding current in the secondary circuit of the welding transformer 120 which includes a pair of electrodes 124a and 124b, and workpieces 126 and 128 to be spot-welded.

Figure 11:
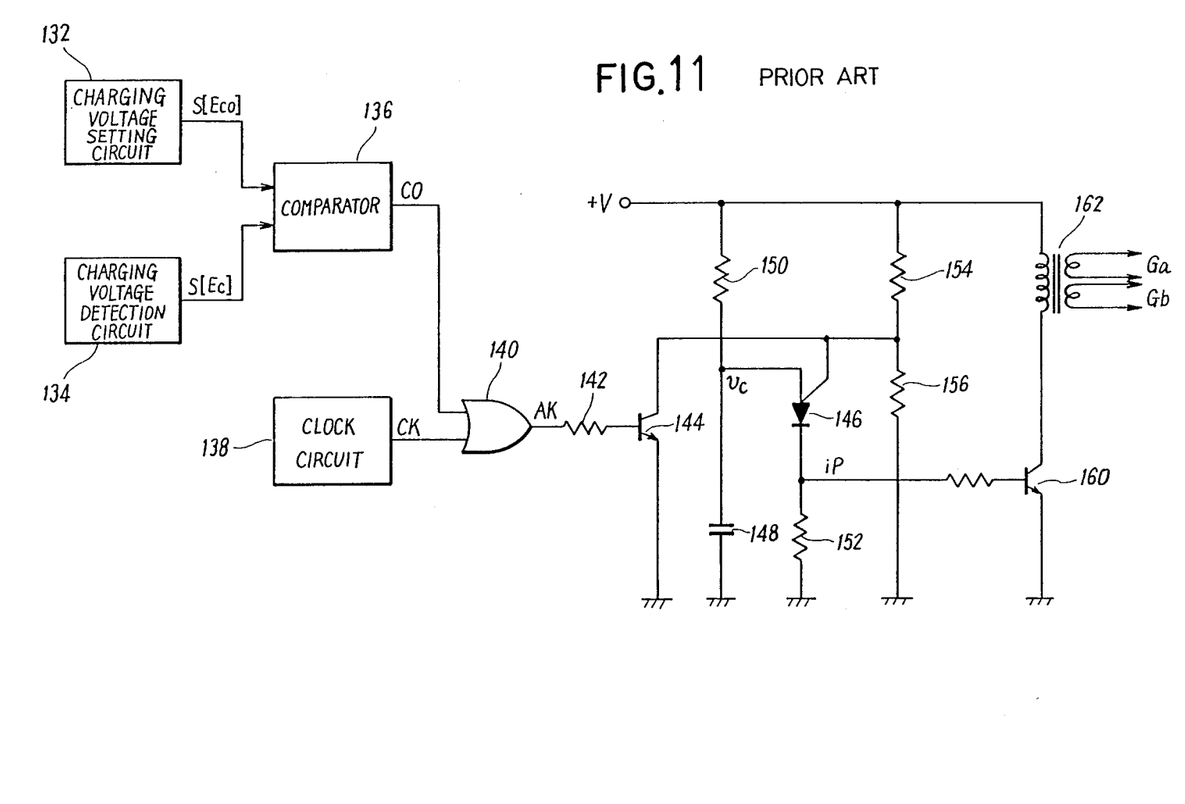
FIG. 11 is a block diagram of a conventional charging circuit incorporated in the power unit of FIG. 10.

FIG. 11 shows the circuit diagram of a conventional charging control circuit 130, and FIG. 12 shows various waveforms of voltage signals and the current appearing in the circuit 130 as well as the waveform of the charging current Ic.

Figure 12A:
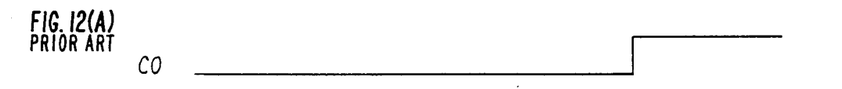
FIG. 12 is a waveform diagram showing the waveforms of voltage signals and current appearing in the circuit of FIG. 11 as well as the waveform of the charging current flowing in the power unit of FIG. 10.
Figure 12B:
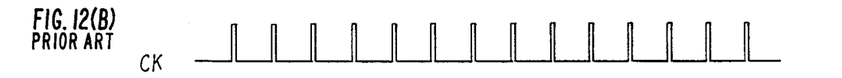
Figure 12C:
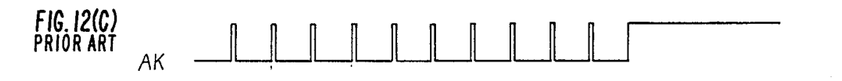
Figure 12D:
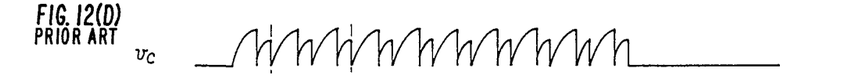
Figure 12E:
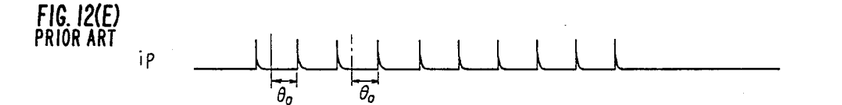
Figure 12F:
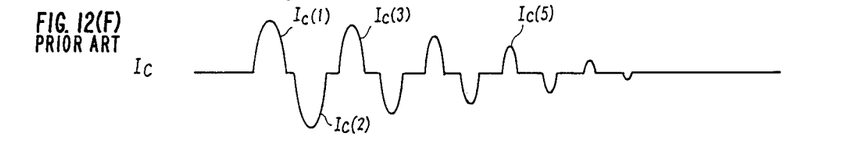

Referring to FIG. 11, a PUT (Programmable Unijunction Transistor) 146, a capacitor 148 and resistors 150 and 156 constitute an oscillation circuit to generate a current pulse ip with a fixed period which, typically, is shown in FIG. 12(E). The current pulse ip periodically makes a transistor 160 conductive so that the thyristor firing pulses Ga and Gb are generated from the secondary winding of a transformer 162, thereby obtaining the charging current Ic which is shown in FIG. 12(F). A clock circuit 138 provides a clock pulse CK of a frequency which is the same as to that of the power source to one of the input terminals of an OR gate 140. When the output voltage CO of a comparator 136 is at an "L", i.e. low, level the clock pulse CK can pass through the OR gate 140 and makes a transistor 144 conductive, thereby forcing the capacitor 148 of the PUT circuit to discharge its electrical charge. Each pulse of the current ip is generated after the passage of a time period $\theta$o from the beginning of each discharging. The time period $\theta$o is determined by the capacitance of the capacitor 148 and the resistance of the resistor 150. Thus, the time period $\theta$o is fixed during the charging of the capacitors 112 and 114 and, accordingly, the control angle of the thyristors 106a and 106b is also fixed.

Figure 12G:
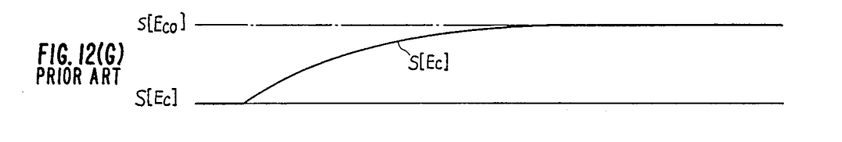

A charging voltage setting circuit 132 provides a constant voltage S[Eco] representing a target value Eco of charging voltage to one of the input terminals of a comparator 136, and a charging voltage detection circuit 134 provides a voltage signal S[Ec] representing the momentary charging voltage Ec of the capacitors 112 and 114 to the other input terminal of the comparator 136. When the capacitors 112 and 114 are charged, the charging voltage Ec increases along a logarithmic curve to the target value Eco as shown in FIG. 12(G). When the target value Eco is attained, the output voltage of the comparator 136 turns an "H", i.e. high, level (see FIG. 12(A)), and hence the OR gate 140 shuts off the clock pulse CK (see FIG. 12(C), making the PUT circuit stop its oscillation (see FIGS. 12(D) and 12(E)). As the result, the generation of the thyristor firing pulses Ga and Gb terminates and, accordingly, the supply of the charging current Ic to the capacitors 112 and 114 is completed (see FIG. 12(F)).

However, the power unit including the conventional charging control unit described as above has several disadvantages as follows.

Figure 13:
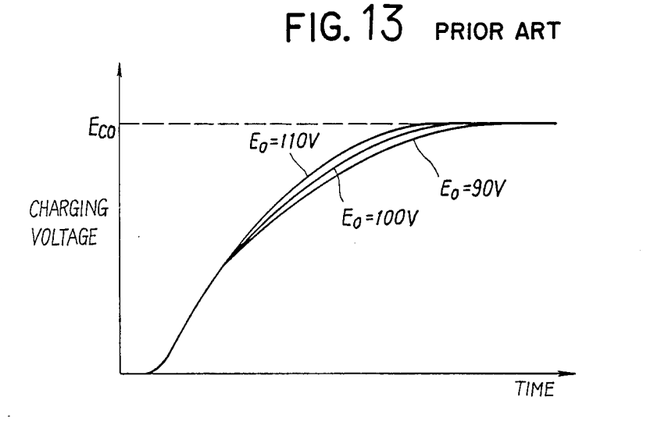
FIG. 13 is a diagram showing charging characteristics of the charging control circuits of FIG. 12 with respect to the supply voltage.

First, when the supply voltage Eo fluctuates, the charging time required for the charging voltage Eo to reach the target value Eco varies, as shown in FIG. 13. In the case where the charging time exceeds a preset charging time, there is a danger of the welding operation starting before the charging voltage reaches the target value Eco because the welding start circuit 170 is set to generate a welding start signal or trigger signal for firing the thyristor 122 in the discharging circuit soon after the passage of a preset charging time. Such a premature starting of welding may be avoided by delaying the time of generation of the welding start signal. But, delaying of a welding start time elongates the duration of each welding cycle, leading to a lowering of the welding productivity.

Secondly, it is necessary to adjust the time constant $\theta$o of the PUT circuit of the charging control circuit 130 according to the frequency of the power source. When the frequency of power source is changed from 60 Hz to 50 Hz, for instance, the necessary charging time is prolonged when the time constant $\theta$o is not adjusted. To maintain the necessary charging time unchanged, it is necessary to reduce the time constant $\theta$o so as to expand or increase the width or the RMS value of the pulses Ic(1), Ic(2),—of the charging current Ic. Thus, the resistor 150 determining the time constant $\theta$o of the PUT circuit must be replaced by another resistor having a different resistance manually or by providing a particular change-over switch.

Thirdly, when the number of the capacitors is increased or decreased to change the welding power, the charging resistor 110 must be replaced by another resistor having a different resistance. If a capacitor is added in parallel to the capacitors 112 and 114 to increase the welding power, for instance, the time constant of the charging circuit is increased and, accordingly, the necessary charging time would be lengthened when the same resistor 110 is used. To ensure that the necessary charging time is maintained constant, the resistor 110 must be replaced by a resistor having a smaller resistance.

Fourthly, the peak level of the charging current Ic is maximum immediately after starting of charging and then decreases exponentially as shown in FIG. 12(F). Such charging characteristics cause the generation of a large amount of heat or power loss in the resistor 110, thereby decreasing charging efficiency.

Fifthly, when the target value Eco of the charging voltage is set far less than the allowable voltage of the capacitor, the charging voltage Ec rises near the target value Eco with the supply of only a few charging current pulses Ic(1), Ic(2),—which have the highest peak levels or largest RMS values as described above. In that case, the charging voltage Ec is likely to fail to precisely reach the target value Eco whereby the weld quality may be lowered.

Lastly, there is a further problem derived from the charging resistor 110 which is connected between the rectifier circuit 108 and the capacitors 112 and 114 for restricting the charging current Ic which flows into the charging circuit. Since the charging current Ic of a high value is supplied through the charging resistor 110 to the capacitors 112 and 114 to store a large amount of electrical energy for a welding operation, a high resistance heat is generated in the resistor 110. This is not only undesirable in respect of the efficiency of power consumption, but also needs a cooling installation, particularly, a water cooling system in the case of a large-scaled welding power unit. Moreover, the resistor 110 is apt to be fatigued with its resistance heat and it is necessary to replace the resistor 110 after a relatively short time period of usage.

SUMMARY OF THE INVENTION

It is an object of the present invention to provide a capacitor type welding power unit which maintains a necessary charging time constant even when the supply voltage is changed.

It is another object of the present invention to provide a capacitor type welding power unit which does not need to change any parts therein when the frequency of supply voltage or the capacitance or the number of capacitors is changed.

It is a further object of the present invention to provide a capacitor type welding power unit which can obtain a precise charging voltage as expected.

It is a further object of the present invention to provide a capacitor type welding power unit which attains a higher charging efficiency and/or a less amount of resistance heat generation in its charging circuit.

It is a further object of the present invention to provide a capacitor type welding power unit which involves little resistance heat or power consumption in charging a capacitor, thus, requires no cooling installation or system.

In accordance with one aspect of the present invention, a control means is provided which controls a charging current being supplied to a capacitor to be substantially constant during the charging of the capacitor. The control means performs a thyristor firing control to make the charging voltage of the condenser follow a reference signal which typically changes linearly in accordance with time. Such a constant-current charging control means minimizes the total power loss being consumed in a resistor in a charging circuit, thereby maximizing the charging efficiency. Since charging voltage increases or decreases linearly with the time, it reaches a preset target value in a predetermined time regardless of fluctuations in the supply voltage.

In accordance with another aspect of the present invention, in addition to the above control means, a capacitor is directly connected to the output terminals of a rectifier circuit. The control means causes a charging current to flow into the capacitor at a substantially constant value without a charging resistor, and the small resistances of a charging transformer and the rectifier circuit serve to restrict the charging current in place of the charging resistor.

BRIEF DESCRIPTION OF THE DRAWINGS

The foregoing and other objects, features, and advantages of the present invention will become apparent from the following description taken in connection with the drawings in which.

PREFERRED EMBODIMENT OF THE INVENTION

Figure 1:
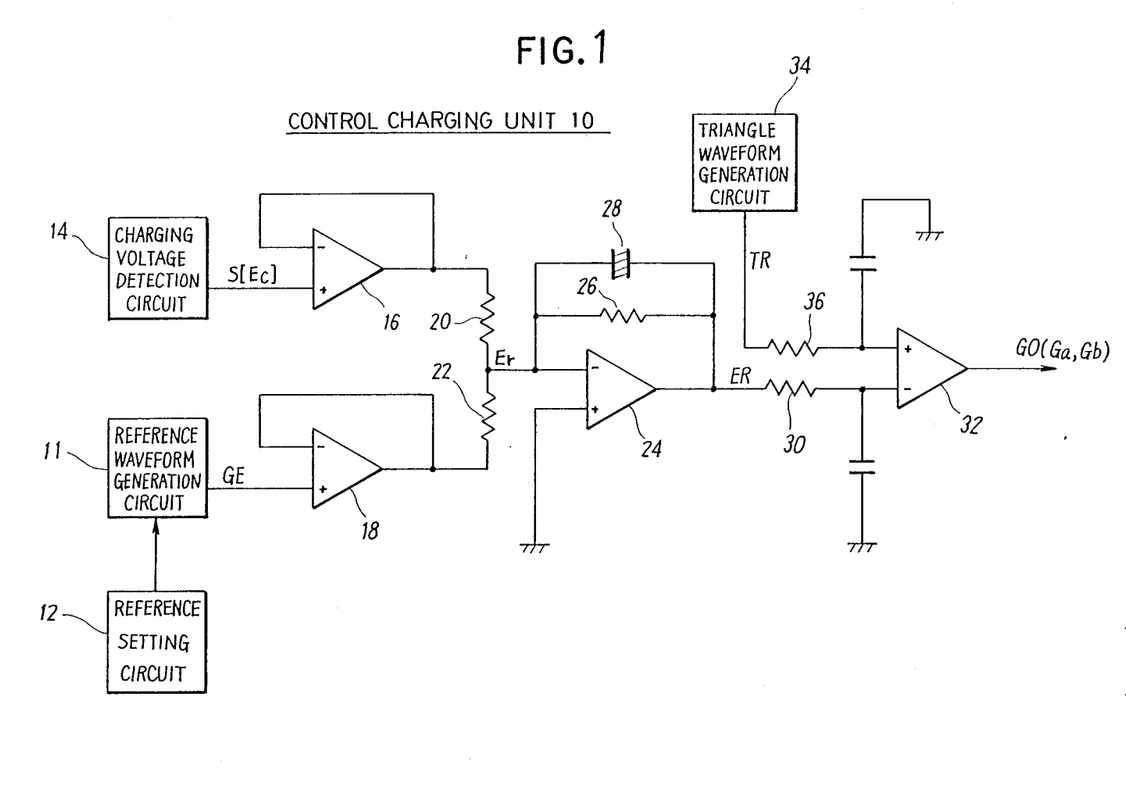
FIG. 1 is a block diagram of a charging control circuit for use in a capacitor type welding power unit according to an embodiment of the present invention.

Referring to FIG. 1, there is shown a charging control circuit according to a preferred embodiment of the present invention, which can be incorporated in the typical single-phase welding power unit of FIG. 10 in place of the conventional charging control circuit 130.

The control circuit 10 includes a reference waveform generation circuit 11 and a charging voltage detection circuit 14. During the charging of the capacitors 112 and 114, the reference waveform generation circuit 11 generates a reference signal GE of a negative polarity, which decreases almost linearly with the time and reaches a saturation value —Em at a predetermined time Te as shown in FIG. 2(2). A reference setting circuit 12 acts to preset the saturation value —Em. The detection circuit 11 detects the momentary charging voltage Ec of the capacitors 112 and 114 to generate a detection signal S[Ec] representing the charging voltage Ec. In accordance with this embodiment, the charging voltage Ec increases almost linearly with the time at a positive porality and, reaches a preset saturation value Eco at a predetermined time Tg as shown in FIG. 2(2). The starting of a welding operator occurs, for instance, at a time Ts. The detection signal S[Ec] and the reference signal GE are transmitted through buffer amplifiers 16 and 18, and resistors 20 and 22 respectively and, then, are added to each other. Since the polarities of the two signals are opposite, this addition results in an error signal Er representative of the error or difference between the absolute values of the detection signal S[Ec] and the reference signal GE.

Figures 3A, 3B:
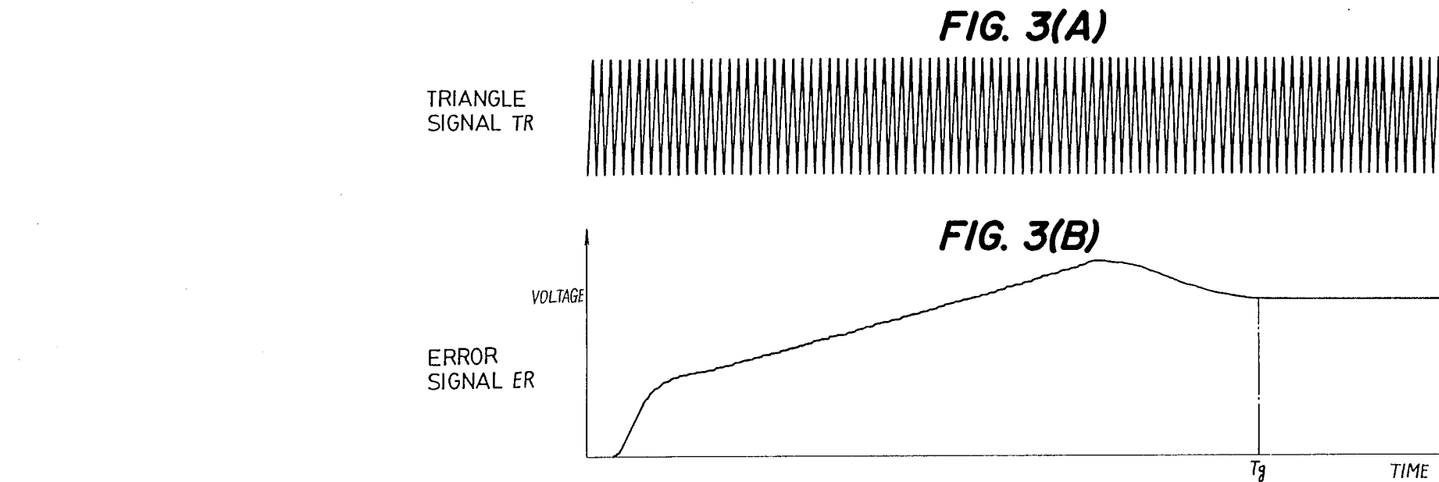
FIG. 3 is a waveform diagram showing the waveforms of signals appearing in the charging control circuit.
Figure 3C:
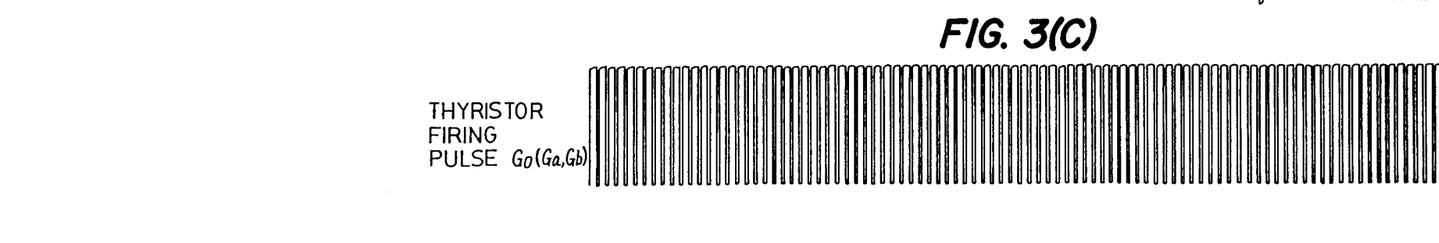
Figure 4A:
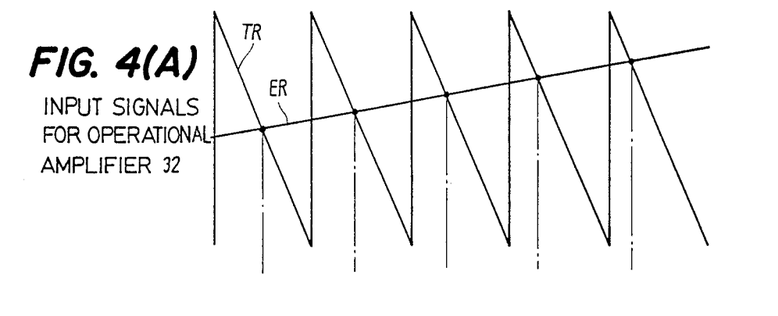
FIG. 4 is a waveform diagram for illustrating the operation of the charging control circuit.
Figure 4B:
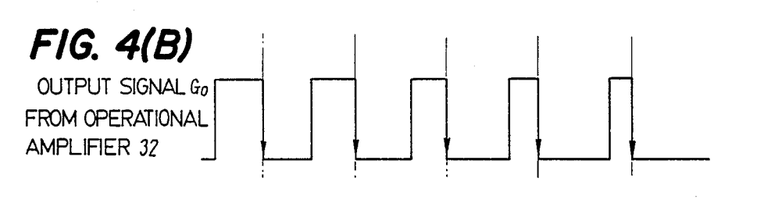

The control circuit 10 further includes an inverting amplifier comprising an operational amplifier 24, a feedback resistor 26, a capacitor 28, a triangle waveform generation circuit 34, and a comparator consisting of an operational amplifier 32. The inverting amplifier 24 acts to invert and amplify the input error signal Er into an output error signal ER as shown in FIG. 3(B). Further, the error signal ER is supplied through a resistor 30 to an inverting input terminal of the operational amplifier 32. The triangle waveform circuit 34 generates a triangle waveform signal TR as shown in FIG. 3(A), and the signal TR is supplied through a resistor 36 to a non-inverting input terminal of the operational amplifier 32. The operational amplifier 32 compares the voltage levels of the input signals ER and TR to generate a binary output signal GO which is an "H" level when ER<TR and is an "L" level when ER>TR as shown in FIGS. 4(A) and 4(B).

Figure 4C:
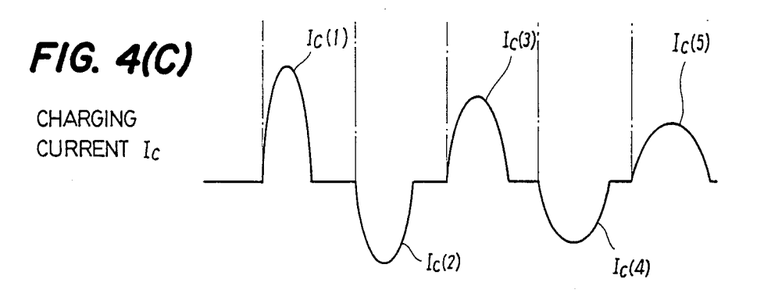

The trailing edges of the binary signal GO alternately provide thyristor firing pulses Ga and Gb for turning the thyristors 106a and 106b on respectively, thus obtaining a charging current Ic as shown in FIG. 4(C), wherein the control angles are gradually reduced so that the pulse widths of the current pulses Ic(1), Ic(2), Ic(3),—increase gradually. Thus, the charging electric energy per current pulse is kept constant even though the peak levels of the current pulses Ic(1), Ic(2), Ic(3-),—decrease gradually. In this way, the charging current Ic is supplied to the capacitors 112 and 114 is controlled to be substantially constant, and the charging voltage Ec increases almost linearly and up to the target value Eco in the predetermined time Tg as shown in FIG. 2(C). It is noted in FIGS. 4(A)-4(C) that the waveforms are exaggerated for facilitation of the understanding of the explanation.

According to the charging control circuit mentioned above, most of the disadvantages in the conventional control unit are removed as follows.

Figure 7:
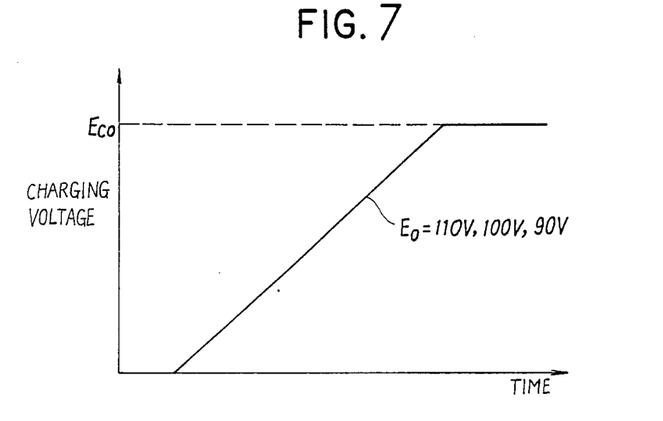
FIG. 7 is a diagram showing charging characteristics of the charging control circuits of FIGS. 1 and 6 with respect to the supply voltage.

First, the charging voltage Ec changes with the time along a fixed characteristic curve regardless of variations in the supply voltage Eo as shown in FIG. 7. Now, it is assumed that the supply voltage Eo has decreased from a rated value 100 V to a lower value 90 V. Then, the peak levels of the current pulses Ic(1), Ic(2), Ic(3-),—will decrease and, therefore, the characteristic curve of the charging voltage Eo tends to decline. However, the decrease of the peak levels of the current pulses causes an increase in the comparison error Er and accordingly the error signal ER, thereby reducing the control angle so that the pulse widths of the current pulses are increased so as to compensate for the decrease of corresponding peak levels. Therefore, the charging voltage Ec changes with the time along the same characteristic curve as that in the case of 100 V. When the supply voltage Eo increases from the rated value 100 V to a higher value 110 V, the operation is contrary, but a similar result is obtained.

Secondly, it is not necessary to replace or adjust any parts in the control unit when the frequency of the power source is changed. If the frequency is changed from 60 Hz to 50 Hz, for instance, the intervals of the current pulses Ic(1), Ic(2), Ic(3),—will increase. Then, the charging rate or the increasing rate of the charging voltage Ec tends to decrease. However, the increase in the intervals of the current pulses causes an increase in the error signal ER which thereby reduces the control angle, resulting in an increase in the pulse widths of the current pulses and, accordingly, to an increase in the amount of charge per current pulse. Thus, a similar charging rate as that in the 50 Hz case is automatically assured.

Thirdly, the change in the capacitance or the number of the capacitors does not require the substitution or changing of the charging resistor 110 for maintaining the charging time unchanged. Assuming that the capacitor 114 is removed, leaving the capacitor 112 in use, for reducing the total capacitance. In that case, the charging rate is accelerated with the smaller capacitance, but the error signal ER is decreased and the control angle is correspondingly expanded such that the pulse widths of the current pulses and the amount of charge per current pulse are decreased. As the result, the acceleration of the charging rate is suppressed, but the obtained charging time is the same as that of the case with the capacitor 114 being provided.

Fourthly, since the charging current Ic which is controlled to be constant flows through the charging resistor 110, the total resistance heat or the power loss generated in the resistor during charging is minimized, and a higher welding efficiency is obtained.

Fifthly, even when the target value Eco is set far lower than the allowable voltage of the capacitor, the constant-current control of this embodiment enables the charging voltage Ec to reach precisely the target value Eco. In that case, the constant-current control provides more current pulses than that of the conventional control, and causes the charging current Ic to be smoothly attenuated in accordance with the reference waveform GE just before the completion of the charging.

Figure 2A:
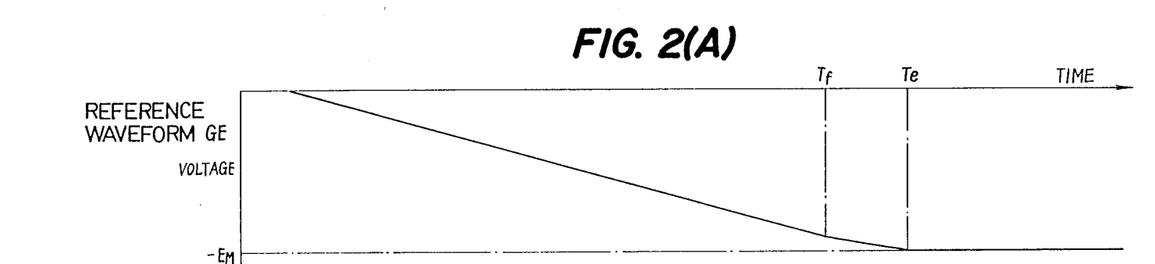
FIG. 2 is a waveform diagram showing the waveforms of voltages and current appearing in the charging control unit.
Figure 2B:
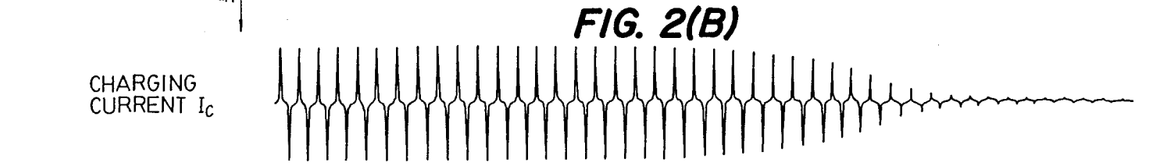
Figure 2C:
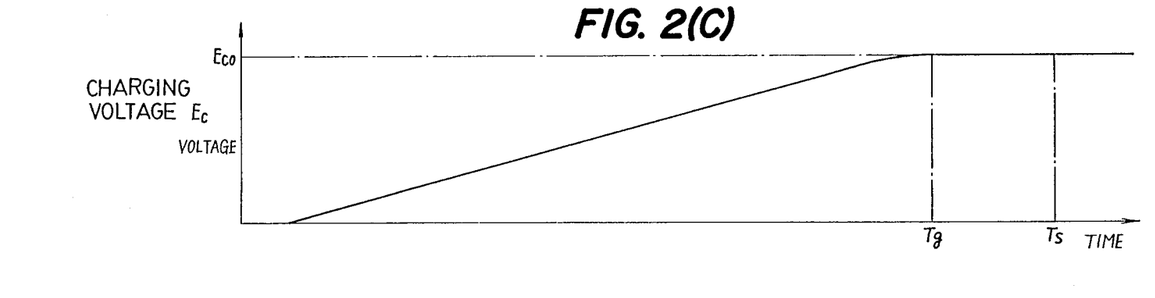

It is noted that the decreasing rate or slope of the reference waveform GE is small at and near to the charging completion time Te as shown in time Tf in FIG. 2(A), whereby the charging voltage Ec smoothly reaches the target value Eco as shown in FIG. 2 (C) and the charging current Ic is smoothly attenuated as shown in FIG. 2(B).

Figure 5:
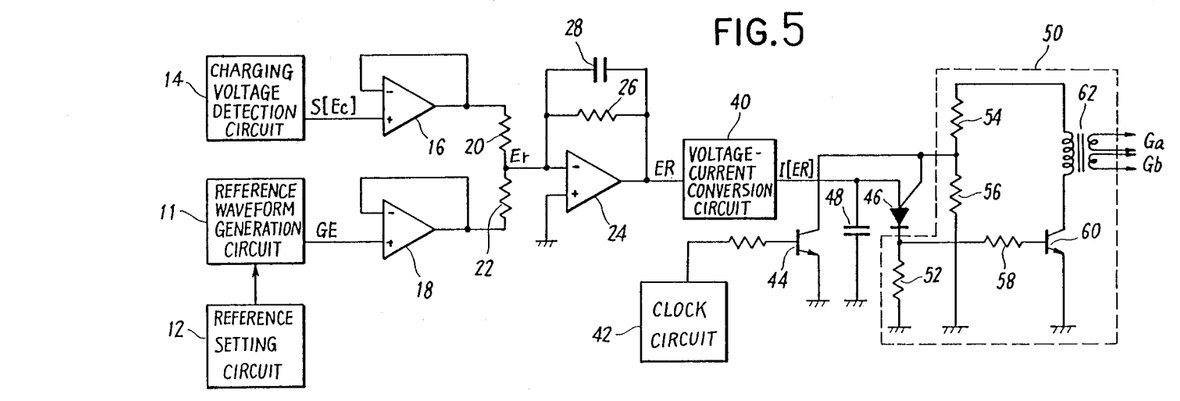
FIG. 5 is a block diagram of a charging control circuit in accordance with another embodiment of the present invention.
Figure 6:
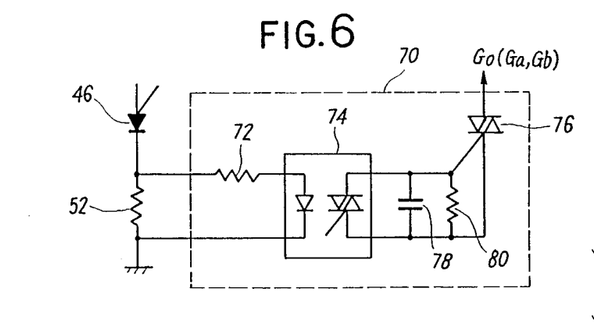
FIG. 6 is a circuit diagram of a part of the charging control circuit of FIG. 5.

Referring to FIG. 5, there is shown another control circuit 10 including a PUT circuit in which the pulse output of the PUT 46 varies in accordance with an error signal ER. The error signal ER is converted to a current I[ER] which is then supplied to the anode of the PUT 46 and to the capacitor 48. FIG. 6 illustrates a modified form of the circuit block 50 of FIG. 5, which includes a photo-triac 74 and a triac 76.

Figure 8:
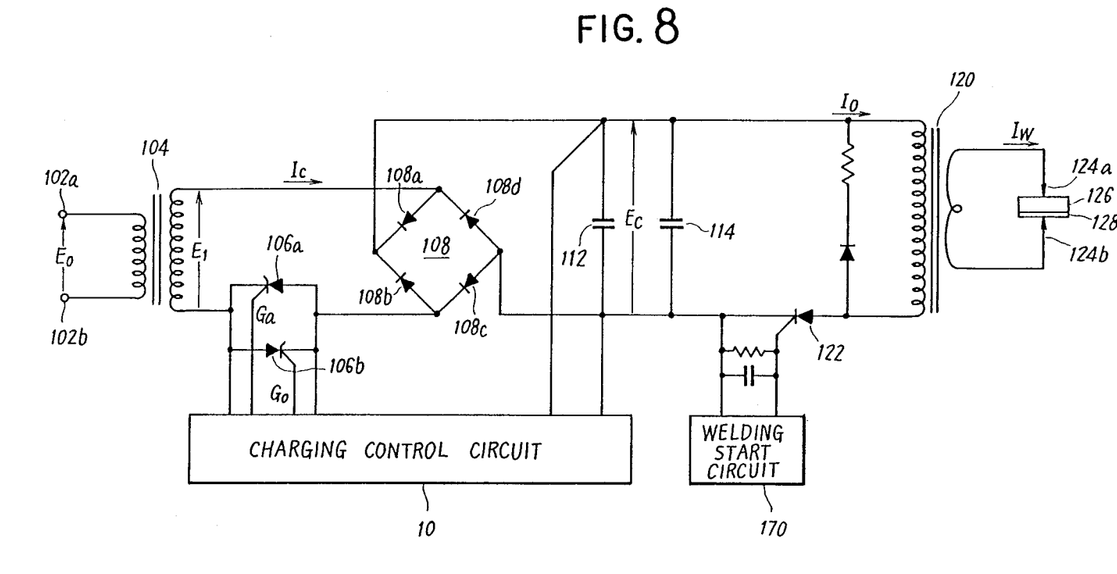
FIG. 8 is a block diagram of a single-phase capacitor type welding power unit in accordance with a further embodiment of the present invention.

Referring now to FIG. 8, another embodiment of the invention is shown. The circuit is similar to the above described embodiment except that no charging resistor is provided. Namely, the capacitors 112 and 114 are directly connected to the output terminals of the rectifier circuit 108. In this embodiment, the charging current Ic is controlled to be constant during charging by the charging control circuit 10 in the same manner as in the above described embodiment, and there is accordingly no danger that the charging current Ic excessively flows in the charging circuit without a charging resistor. Thus, there is no problem related with the charging resistor, particularly, resistance heat or excessive power consumption and, it is not necessary to provide a cooling installation for heat radiation, and the voltage drop across a charging resistor is small. The last feature (voltage drop) enables the charging transformer 104 to produce a lower output voltage, and to therefore be small-sized. It is noted that the charging circuit has a small total resistance which is composed of the resistances of the charging transformer 104, the thyristors 106a and 106b, and the diodes 108a 108d of the rectifier circuit 108. In place of a charging resistor the total resistance serves to restrict the charging current Ic, and the resistance heat generated by the small total resistance and the constant controlled charging current Ic is very little.

Figure 9:
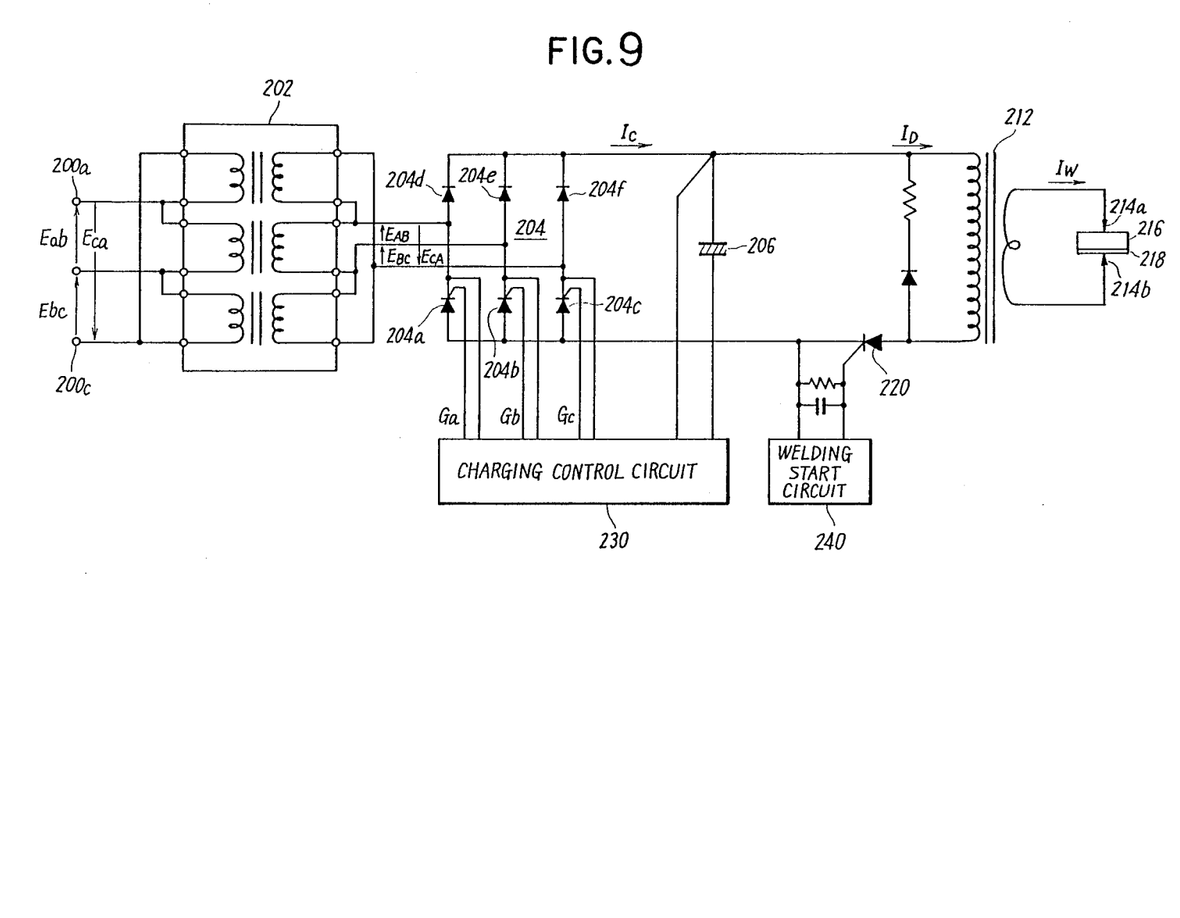
FIG. 9 is a block diagram of a three-phase capacitor type welding power unit in accordance with a still further embodiment of the present invention.

With reference to FIG. 9, a power unit of the three-phase type according to a further embodiment of the invention includes a three-phase charging transformer 202, a three-phase rectifier circuit 204, and a three-phase charging control circuit 230. The charging transformer 202 receives, at its delta-connected primary windings, three-phase commercial AC voltages Eab, Ebc and Eca having 200 V respectively, and generates from its delta-connected secondary windings three-phase voltages EAB, EBC and ECA having, for example, 400 V respectively. The rectifier circuit 204 has three thyristors 204a, 204b and 204c and three diodes 204d, 204e and 204f which are bridge-connected in three-phase form. The thyristors 204a, 204b and 204c are alternately turned on with a period of 120° to generate a DC voltage pulse. A capacitor 206 is directly connected to the output terminals of the rectifier circuit 204. The control circuit 230 monitors the charging voltage of the capacitor 206, and stops the firing of the thyristors 204a, 204b and 204c to terminate the charging when the charging voltage reaches a preset target value.

The control circuit 230, which may be constructed by modifying the single-phase control circuit 10 into a three-phase fashion, provides three-phase firing pulses Ga, Gb and Gc to the thyristors 204a, 204b and 204c at a control angle which is variable in accordance with the error between the detected charging voltage of the capacitor 206 and the reference waveform signal, so that the charging current Ic being supplied to the capacitor 206 is constant and so that the charging voltage increases linearly with time up to the target value. A welding transformer 212, a welding start circuit 240 and so on operate in the conventional manner, respectively. Consequently, the same advantages as those of the single-phase type are obtained.

While only a limited number of embodiments of the present invention have been specifically disclosed, it will be apparent that many variations and modifications can be made by persons skilled in the art within the scope of the present invention defined by the accompanying claims.

What is claimed is:

1. A capacitor type welding power unit in which one or more thyristors are controlled to charge a capacitor that is made to instantaneously discharge an electrical charge stored therein to produce a welding current after the charging voltage of said capacitor has reached a predetermined target value, comprising:
   a means for generating a reference signal which changes linearly with time during the charging;
   a means for detecting the charging voltage of said capacitor;
   a means for comparing the detected charging voltage and said reference signal and for generating an error signal representative of the difference therebetween; and
   a means for controlling the control angle of said one or more thyristors in accordance with said error signal so that the charging voltage of said capacitor changes linearly with time during the charging.

2. The welding power unit of claim 1, wherein said thyristor control means comprises a circuit for generating a triangle waveform signal and a comparator for comparing said error signal with said triangle waveform signal to produce a binary output signal having binary levels corresponding to the result of comparison, said binary signal being used to turn said thyristors on.

3. The welding power unit of claim 1, wherein said thyristor control means comprises a PUT circuit responsive to said error signal for producing a current pulse with a period varying in accordance with said error signal, and a circuit responsive to said current pulse for generating a thyristor firing signal to be supplied to said thyristors.

4. The welding power unit of claim 1, wherein said reference signal generating means comprises a means for reducing the slope of change of rate of said reference signal at a time near to a charging completion time when the charging voltage of said capacitor has reached said predetermined target value so that the charging voltage of said capacitor smoothly reaches said predetermined target value.

5. A capacitor type welding power unit in which a commercial AC voltage is boosted by a transformer into an AC voltage having a predetermined value and then is supplied through one or more thyristors to a rectifier circuit that in turn converts said AC voltage into a DC voltage, and said DC voltage is directly supplied to a capacitor to be charged, said capacitor being made to instantaneously discharge an electrical charge stored therein to produce a welding current after the charging voltage to said capacitor has reached a preset target value, comprising:
- a means for generating a reference signal which changes linearly with time during the charging;
- a means for detecting the charging voltage to said capacitor;
- a means for comparing the detected charging voltage with said reference signal and for generating an error signal representative of the error therebetween; and
- a means for controlling the control angle of said one of more thyristors in accordance with said error signal so that the charging voltage of said capacitor changes linearly with time during the charging.

6. A capacitor type welding power unit in which a multiphase commercial AC voltage is boosted by a multi-phase transformer into a multi-phase AC voltage having a predetermined value and then is supplied through thyristors to a multi-phase rectifier circuit that in turn converts said AC voltage into a DC voltage, and said DC voltage is directly supplied to a capacitor to be charged, said capacitor being made to instantaneously discharge an electrical charge stored therein to produce a welding current after the charging voltage of said capacitor has reached a preset target value, comprising:
- a means for generating a reference signal which changes linearly with time during the charging;
- a means for detecting the charging voltage of said capacitor;
- a means for comparing the detected charging voltage with said reference signal and for generating an error signal representative of the error therebetween; and
- a means for controlling the control angle of said thyristors in accordance with said error signal so that the charging voltage of said capacitor changes linearly with time during the charging.

* * * * *